United States Patent [19]

Eugene

[11] 3,964,002
[45] June 15, 1976

[54] PUSH-BUTTON T.V. TUNER

[75] Inventor: Emmanuel Eugene, Brooklyn, N.Y.

[73] Assignee: Lawrence Peska Associates, Inc., New York, N.Y. ; a part interest

[22] Filed: July 14, 1975

[21] Appl. No.: 595,712

[52] U.S. Cl. .................................. 334/7; 334/50
[51] Int. Cl.² ........................................ H03J 5/08
[58] Field of Search ............... 334/7, 47, 50, 51, 54; 325/464, 465

[56] References Cited
UNITED STATES PATENTS

| | | | |
|---|---|---|---|
| 2,582,039 | 1/1952 | Jones | 334/7 X |
| 3,206,988 | 9/1965 | Hopt et al. | 334/7 X |

Primary Examiner—Paul L. Gensler
Attorney, Agent, or Firm—Jack D. Slobod

[57] ABSTRACT

A push button VHF television tuner includes a fixedly mounted core, which is a conventional tuner turret cylindrical core having an elongated contact strip for each channel connected to reactive components on switch wafers within the turret. Plungers are arrayed around the circular periphery of the core along each contact element and longitudinally spaced contact rings encircle the core turret and plungers at the location of each contact position on the strips. The plungers carry radially directed contact fingers for bridging between the rings and contacts on the strips upon plunger depression. The loops feed the radio frequency receiving circuitry.

3 Claims, 3 Drawing Figures

U.S. Patent   June 15, 1976   3,964,002
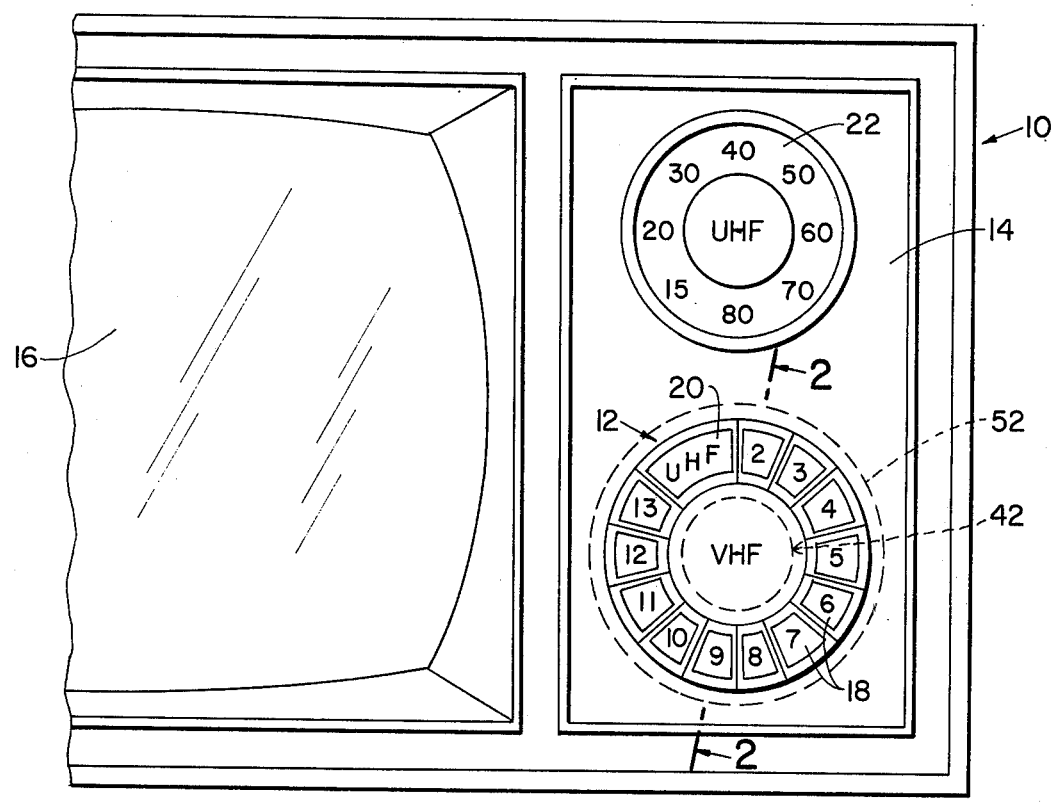
Fig. 1
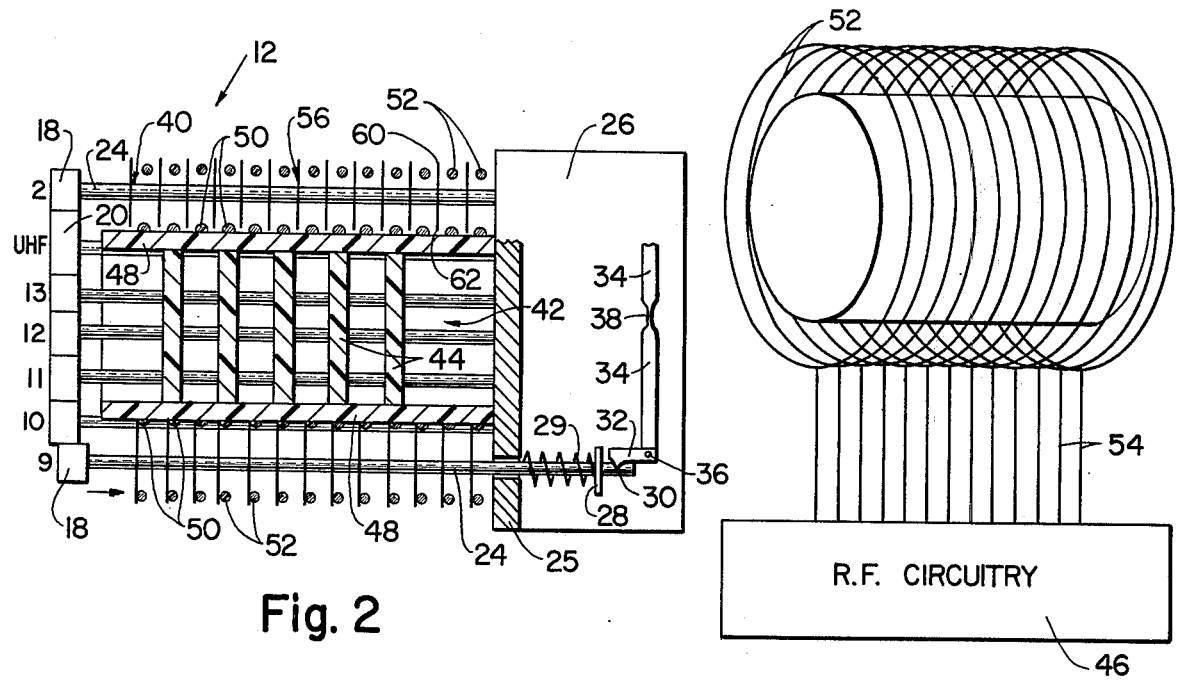
Fig. 2
Fig. 3

PUSH-BUTTON T.V. TUNER

FIELD OF THE INVENTION

The present invention relates generally to push button channel selectors for radio or television receivers. In its particular aspects, the present invention relates to the provision of a core containing electrical components about which plunger translated contacts are arrayed for making operative connection with the electrical components.

BACKGROUND OF THE INVENTION

In usual television receivers a tuner turret containing inductive components is utilized for channel selection. The use of such a turret is rather inconvenient because, in order to change to a desired channel, the turret may have to be rotated as much as 180°. Push button tuners, which have a button for selection of each channel, have heretofore been proposed for use in voltage tuned systems to control potentiometers. Such tuners are more complex and expensive than turret tuners. It has not previously been considered feasible to use push button switches for directly selecting reactive components to tune radio frequency portions of a television receiver because of the difficulty of controlling lead inductance and capacitance.

OBJECTS OF THE INVENTION

It is an object of the present invention to provide a push button tuner for a simple receiver.

It is a further object of the present invention to provide a push button tuner for direct insertion of reactive tuning elements, which tuner has controlled and predictable stray reactance.

It is yet another object of the present invention to provide a push button tuner which utilizes a turret tuner element as a core.

SUMMARY OF THE INVENTION

Briefly the aforementioned and other objects of the present invention are satisfied by utilizing an ordinary cylindrical tuner turret core containing reactive elements on switch wafers interconnected with surrounding longitudinally elongated contact strips. Instead of rotating the turret core to bring a contact strip in line with brushes, the core is fixedly mounted. The core is encircled with longitudinally spaced rigid rings which are connected to the r.f. section of the receiver in the same maner as brushes would be. A plurality of longitudinally directed plungers are spaced apart angularly in an annular region between the core and the rings. Contact fingers are spaced along the plunger to bridge between each contact of an associated contact strip and each ring upon depression of the plunger.

The tuner provides a predictable structure, utilizing leads only in a similar manner as are ordinarily connected to contact brushes for a turret, to provide predictable stray reactance parameters.

Other objects, features and advantages of the present invention will become apparent upon perusal of the following detailed description of the present invention when taken in conjunction with the appended drawing wherein:

FIG. 1 is a front elevation of a television receiver including the push button tuner of the present invention;

FIG. 2 is a cross-sectional view of the push button tuner along the lines 2—2 in FIG. 1; and FIG. 3 is a pictorial presentation of portions of the push button tuner in FIG. 2.

DETAILED DESCRIPTION

Referring first to FIG. 1, the front face of a television receiver 10 is illustrated having a VHF tuner module 12 installed on the usual panel 14 alongside picture tube face 16. Tuner 12 comprises a circular array of channel selector push buttons 18. There are twelve pushbuttons 18 in one to one correspondence with the VHF channels 2 through 13. Further, an additional pushbutton 20, in the circular array, is provided to switchably connect the UHF tuner 22, also located on front face 14, for operation in receiver 10.

Now referring also to FIG. 2 of the drawing, the various pushbuttons 18 and 20 are each secured to an end of a different shaft 24. The shafts 24 project in parallel into the depth of receiver 10. Each shaft 24, at an end remote from the pushbuttons 18, is received through an apertured wall 25 of a mechanism 26. Stops 28 are provided on shafts 24 behind wall 25 to trap the shafts in mechanism 26. Further there is provided a tensionable spring 29 along each shaft 24 connected between wall 25 and stop 28 for urging the shaft to project outward with stop 28 resting close to wall 25.

Each shaft 24 may be translated into the depth of receiver 10 upon depressing its associated pushbutton 18. For retaining each shaft 24 in a position corresponding to depression of the pushbutton 18, a detent 30 is formed on the shaft which is engaged by a pivoted finger 32. The various fingers 32 include a radially inwardly directed leg 34 which pass from the finger pivot 36 near each shaft 24 to a common hinge 38 at the center of mechanism 26. The legs 34 form a spider structure having a resilient center at hinge 38 which constrains all the fingers 32 to be rocked around their respective pivots 36 simultaneously. Thus, the depression of any pushbutton 18 causes the associated finger 32 to be rocked upon seating into detent 30. As a consequence, the other fingers 32 are simultaneously rocked to release any previously depressed pushbutton which is returned to a normal position by spring 29.

It should be apparent that the combined pushbuttons 18 and shafts 24 may be described as a circular array of parallel plungers 40. The cylindrical space surrounded by plungers 40 is filled preferably with a standard tuner turret element 42. Rather than being rotatable, turret element 42 is fixedly mounted at its rear end to wall 25 of mechanism 26.

Turret element 42 comprises a unit such as disclosed in U.S. Pat. No. 2,798,955 to E. J. Balash, issued July 9, 1957 which is herein incorporated by reference. As is usual, element 42 comprises a plurality of longitudinally spaced circular switch wafers 44 on which are disposed inductive electric components for selection to tune radio frequency amplifier, local oscillator and mixer circuitry forming the r.f. section 46 (FIG. 3) of receiver 10. Turret element 42 further includes a circular array of thirteen longitudinally directed contact strips 48 having contacts 50 interconnected to the components on switch wafers 44 in a manner that the longitudinally spaced apart contacts 50 on a particular contact strip 48 are engaged for selection of a particular channel.

Referring also to FIG. 3, rather than utilizing fixedly positioned longitudinally spaced wipers, connected to r.f. circuitry 46, for engaging the contact strips 48 on a rotating turret, a series of longitudinally spaced conductive rings 52 surround the fixed turret element 42 at the location of each contact 50. Rings 52 are connected to r.f. circuitry 46 by leads 54 in the same manner as brushes would be connected thereto.

Each shaft 24 is directed along a corresponding one of contact strips 48. Plural longitudinally spaced conducting fingers 56 are carried by each shaft 24. Each finger 56 has a radially outwardly directed end 60 extending between rings 52 and a radially inwardly directed end 62 extending between contacts 50. Upon depression of a desired pushbutton 18, the associated contact fingers 56 are brought in bridging relationship, as shown for channel 9 in FIG. 2, between the series of contacts 50 on the associated strip 48 and the series of rings 52.

It will be appreciated that the tuner 12, because of its symmetry and predictably positioned elements introduces only predictable and repeatable stray reactances into the radio frequency circuitry 46.

Having described the preferred embodiment of the present invention in great detail, it should be apparent that numerous modifications, additions and omissions in the details thereof are possible within the intended spirit and scope of the invention.

What is claimed is:

1. A push button multi-channel tuner module for a signal receiver comprising an elongated core containing electrical components, a plurality of longitudinally directed contact strips spaced around the periphery of said core, said strips being electrically connected to said components in a manner that each contact strip is associated with a different channel, fixed contact means positioned about said core and adapted to be connected to said receiver, a plurality of longitudinally directed channel selector plungers spaced around said core along said contact strips, said plungers passing along said fixed contact means, and translatable contact means carried by each plunger for electrically bridging between a corresponding one of said contact strips and said fixed contact means upon depression of said plunger.

2. The module of claim 1 wherein said fixed contact means comprises plural longitudinally spaced contact elements encircling said core over said plungers.

3. The module of claim 2 wherein said core, contact strips, and components comprise a fixedly positioned tuner turret element.

* * * * *